SEMICONDUCTOR DEVICES HAVING A LOW CAPACITANCE JUNCTION

Filed Aug. 30, 1967

INVENTOR.
GENE P. WECKLER
BY Gordon H. Telfer
ATTORNEY

United States Patent Office 3,532,945

Patented Oct. 6, 1970

3,532,945

SEMICONDUCTOR DEVICES HAVING A LOW CAPACITANCE JUNCTION

Gene P. Weckler, Campbell, Calif., assignor to Fairchild Camera and Instruments Corporation, Syosset, N.Y., a corporation of Delaware Filed Aug. 30, 1967, Ser. No. 664,494

Int. Cl. H01l 5/00

U.S. Cl. 317—235 6 Claims

ABSTRACT OF THE DISCLOSURE

Fabrication of semiconductor devices is described having a junction of low capacitance, such as a collector junction in a phototransistor, by forming a thin, lower resistivity layer on a higher resistivity substrate prior to diffusion of the junction forming region. This provides a junction having low capacitance per unit area and avoids the necessity of diffusing a guard ring to eliminate undesirable surface effects.

BACKGROUND OF THE INVENTION

Field of the invention

This invention relates generally to semiconductor devices and methods for their fabrication, that require relatively large area stable junctions with low capacitance. One application of the invention is in photosensitive semiconductor devices such as photodiodes and phototransistors although the invention may also be applied to semiconductor devices for other purposes.

Description of the prior art

To the present it has been a common practice to produce phototransistors by employing relatively low resistivity material as the starting material, such as, in the case of an NPN transistor, a body of N-type silicon having a resistivity of about 3 ohm-centimeters. Base and emitter regions are successively diffused into the starting material by conventional selective diffusion techniques. The structure differs from normal double diffused transistors mainly in the fact that the collector junction area is made relatively large, such as about 1,000 to 1,200 square mils, compared to an emitter junction area of typically about 20 square mils. Techniques for fabricating such devices are well-known.

Since the gain-bandwidth product of the resulting device is inversely porportional to the capacitance of the device, the ordinary double diffused structure results in a gain-bandwidth product that is too limited for some applications. It has been recognized that increasing the resistivity of the starting material would result in improvement of the gain-bandwidth product by decreasing the base-collector junction capacitance along with an increase in space charge volume that results from the use of high resistivity material. If, for example, the starting material is selected to be of 100 ohm-centimeters material and other fabrication operations are the same as an ordinary phototransistor, considerable reduction in capacitance can be achieved. Unfortunately, the direct substitution of a higher resistivity substrate for that previously used encounters other problems that make it an ineffective solution for most purposes. These problems result principally from the surface effects incident to high resistivity material causing excess surface leakage currents and unstable breakdown voltage. These surface effects result primarily from charges being held at the surface by ions trapped in the surface passivation layer. In high resistivity material such charges produce a greater effect than on lower resistivity material that has a greater number of doping impurities. Also, the space charge layer extends to a greater area of the surface of high resistivity material. The art-recognized solution to such undesirable surface effects is to diffuse a guard ring of low resistivity surrounding and spaced from the junction whose characteristics it is desired to control. Unfortunately the guard ring adds considerable capacitance to the base-collector junction so that in the past the designer of a device having a low capacitance junction has been faced with a dilemma of contradictory requirements resulting in serious design components and limited applicability of such devices.

Therefore, the prior art has failed to provide a single structure and method of fabrication that achieves a stable junction with low capacitance per unit area as is desired in semiconductor devices such as photodetectors.

SUMMARY OF THE INVENTION

The present invention overcomes the disadvantages of the prior art by a fabrication technique that includes the use of a high resistivity substrate on which is formed, prior to diffusion of the base region, a layer of lower resistivity material of the same conductivity type. More particularly, the substrate is selected to be a material that has a resistivity preferably considerably greater than 10 ohm-centimeters while the additional layer of low resistivity is preferably considerably less than 10 ohm-centimeters. The diffused base region extends through the low resistivity layer into the starting material of high resistivity. The junction is therefore principally formed in the high resistivity material providing low capacitance and a large space charge region. The low resistivity material stabilizes the surface without the additional use of a guard ring that would add junction capacitance. The formation of the additional low resistivity layer on the starting material is by epitaxial growth so that it can be relatively thin and of controlled resistivity to ensure that the diffusion front of opposite type impurities penetrates entirely through as a result of the base diffusion.

DESCRIPTION OF THE PREFERRED EMBODIMENTS

Figure 1:
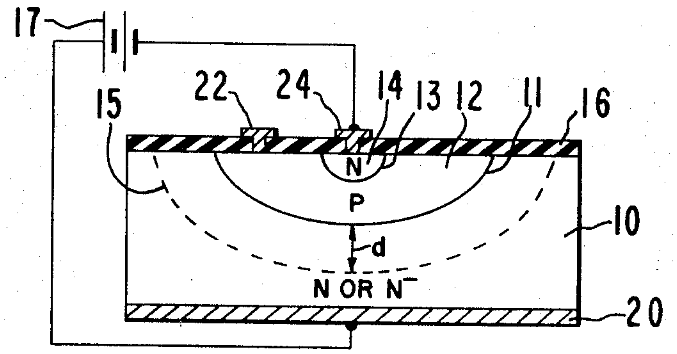
FIG.1 PRIOR ART
FIG. 1 is a cross-sectional vew of a semiconductor device in accordance with the prior art and, FIGS. 2–4 are sectional views of a device in accordance with this invention at successive stages in the fabrication process.

Referring to FIG. 1, there is shown an example of a transistor structure in accordance with the prior art. The structure includes a substrate or collector region 10 having successively diffused base and emitter regions 12 and 14 therein forming junctions 11 and 13 covered by a passivating layer 16. Contacts 20, 22, and 24 are formed respectively on regions 10, 12, and 14. The structure is like that of a conventional double diffused planar transistor but in this case is one particularly designed to have large collector junction area as is desirable in some types of devices such as photodetectors. Typically the collector junction area is at least about 50 times greater than the emitter junction area. Ordinarily the starting material in such devices would be of relatively low resistivity such as about 3 ohm-centimeters. An effort may be made to improve device characteristics by lowering junction capacitance and increasing the space charge volume through the use of a higher resistivity substrate. FIG. 1 illustrates a space charge region 15 resulting from the application of a reverse bias across the collector junction 11 by, for example, a potential source 17 connected across the emitter and collector contacts 24 and 20, respectively. Base contact 22 is often not used, and need not be present, in a phototransistor. Space charge region 15 extends a distance *d* from the collector junction approximately uniformly resulting in problems of surface instability as were discussed in the introduction.

Devices in accordance with this invention may have features in common with that of FIG. 1, for example, the configuration of the base and emitter regions and the disposition of contacts may be similar. It is, however, the nature of the collector region and the manner in which it is formed that are principally improved in accordance with this invention.

Figure 2:
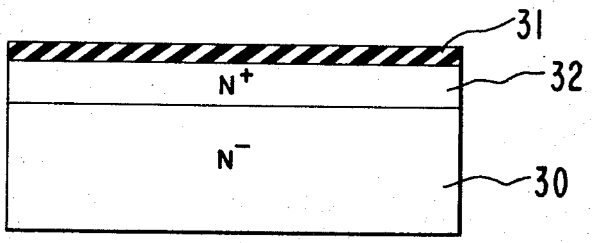

Referring now to FIG. 2, there is shown a starting body or substrate 30 of a high resistivity material which in the context of the present invention is intended to mean one having a resistivity of at least about 10 ohm-centimeters and preferably considerably more. The starting material may be of usual commercial grade, monocrystalline silicon or other suitable semiconductor material and the conductivity type indicated refers only to that employed in the fabrication of an NPN (or NPIN) structure. However, it will be recognized that corresponding PNP (or PNIP) structures as well as other structures such as diodes having a junction like that of the collector junction under discussion may also be formed.

On a surface of the substrate 30 is a thin layer 32 of material of the same conductivity type but of lower resistivity than the substrate. Layer 32 is designated as N+ in contrast with the N− designation of the substrate 30. This layer is formed by epitaxial growth employing conventional techniques such as the thermal decomposition of silicon tetrachloride with hydrogen with a doping agent included among the reactants to provide the desired resistivity. The resistivity of the layer 32 is between about 1 ohm-centimeter and 10 ohm-centimeters, preferably near the lower end of that range. A minimum resistivity of about 1 ohm-centimeter is preferred to provide adequately high breakdown voltages. At least an order of magnitude difference in the resistivities of the starting material and epitaxial layer is desirable. The layer 32 should be as thin as is conveniently possible, preferably about 2 microns or less. It must always be less thick than the desired depth of the base region. Typically, in the resultant device the layer 32 is less than half the thickness of the diffused base region. The surface is covered with an insulating layer 31 such as thermally grown silicon dioxide as is conventionally employed in the fabrication of diffusion masks.

Diffusion of impurities is not suitable for formation of layer 32 because of the practical problems of getting low impurity concentrations in a thin enough layer which will be penetrated by opposite type impurities during the base diffusion. Epitaxial growth permits avoidance of the high surface concentration inherent in diffusion processing. The resistivity of layer 32 is substantially uniform as a result of the control possible in epitaxial growth.

Figure 3:
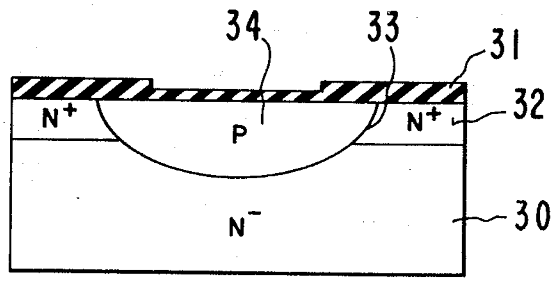

FIG. 3 shows the structure after there has been diffused into the upper surface a quantity of acceptor impurities producing P-type base region 34 that extends entirely through the epitaxial layer 32 producing a junction 33 between the epitaxial layer and substrate and the diffused region. Because of the thinness and controlled resistivity of the epitaxial layer 32, its impurities do not penetrate as deeply as the acceptor impurities and its thickness may be considered approximately the same following diffusion as before. The doping impurity in the epitaxial layer 32 may be one, such as antimony for an N type layer, having a relatively low diffusion constant to minimize changes during subsequent diffusion operations.

Figure 4:
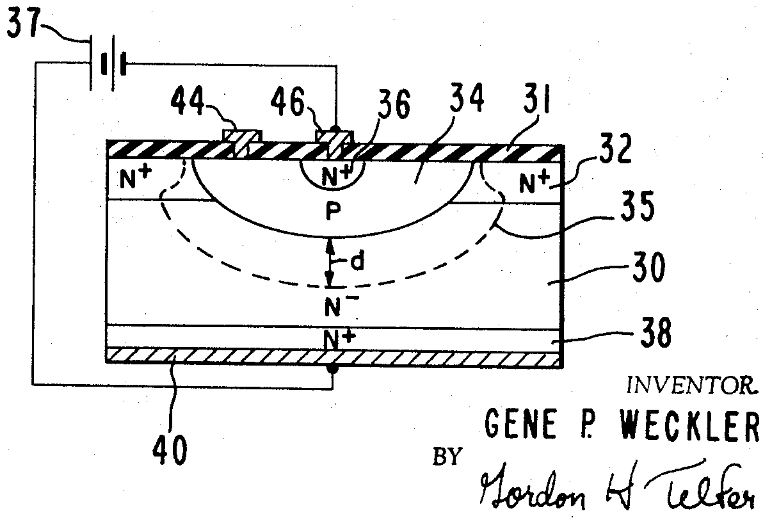

FIG. 4 shows the structure after an emitter region 36 has been diffused into the base region 34 and contacts 40, 44, and 46 have been formed on the substrate 30, the base region 34 and the emitter region 36, respectively. As with prior devices, base contact 44 may be omitted or, if provided, not used. A low resistivity diffused layer 38 is provided on the lower surface of region 30 to facilitate making a good low resistance ohmic contact 40 thus completing the N+PN−N+ (or NPIN) structure. Low resistance is important to achieve a good gain-bandwidth product. An alternative to the structure illustrated is to apply the ohmic collector contact to N+ layer 32 on the top surface of the device.

Since the high resistivity starting material 30 is not used for the purpose of increasing breakdown voltage, as is usually the case in selecting such high resistivity material, but for the purpose of reducing base-collector junction capacitance, the employment of the epitaxial layer 32 of lower resistivity material does not detract from that principal purpose. On the contrary, the layer of epitaxial material is beneficial in stabilizing the surface and reducing the excess surface leakage current which normally occurs in devices made on high resistivity material without a guard ring. This surface stabilization results from the fact that surfaces of low resistivity material are less affected by contamination and by standard processing than are surfaces on high resistivity material. Because the epitaxial layer is so thin, it contributes negligible capacitance to the device, and also limits the space charge volume to only a negligible extent. FIG. 4 illustrates space charge region 35 produced, for example, by reverse bias source 37. The space charge region extends considerably less than distance *d* at the surface due to the lower resistivity material which helps minimize surface leakage. By preventing spread of the depletion layer to the edge of a chip, as may sometimes occur in the prior art devices, the breakdown voltage is increased. However, the total volume of the space charge region is not substantially reduced compared with that in a prior art device of high resistivity starting material.

By way of further example, NPIN phototransistors have been fabricated in accordance with this invention wherein the substrate 30 was of approximately 100 ohm-centimeters N-type material on which was grown a layer 32 of about 1 micron thick of 2 ohm-centimeters N+ material. The base diffusion was performed producing a region 34 of a maximum depth of about 6 microns and surface concentration of about $3 \times 10^{18}$ atoms per cubic centimeter. The emitter diffusion was to a maximum junction depth of within about 1 micron of the collector junction with a surface concentration of about $10^{20}$ atoms per cubic centimeter.

Structures made by this technique have exhibited stable breakdown voltages and negligible excess surface currents over the voltage range of principal interest which is from about 1 to 100 volts. The base-collector capacitance of these structures was less than about one-third of that of an NPN structure of the same geometry employing a low resistivity substrate. All the other optical and electrical characteristics were at least as good and in most cases better than that for the NPN structure. Devices in accordance with this invention, particularly for photodetection, preferably have a high carrier lifetime such as at least about 1 microsecond.

Other applications of interest for devices in accordance with this invention include use in electron beam tubes wherein such structures may comprise a target responsive to the electron beam or in any other application where it is desired to maximize the gain-bandwidth product.

While the present invention has been shown and described in a few forms only, it will be apparent that various modifications may be made without departing from the spirit and scope thereof.

I claim:

1. A phototransistor comprising:

a first semiconductive region of a first resistivity and first conductivity type said first region having a carrier lifetime of at least 1 microsecond;

an epitaxial layer of semiconductive material of said first conductivity type disposed on one surface of said first region, said layer having a substantially uniform second resistivity substantially lower than said first resistivity;

a second semiconductive region of second conductivity type extending from an exposed surface of said layer through said layer into a portion of said first region, said second region forming with said first region and said layer a first PN junction having a termination at said exposed surface;

a third region of said first conductivity type disposed within said second region and forming a second PN junction therewith, said junction having a terminantion at said exposed surface;

contact means for applying a reverse bias across said first PN junction said contact means including an ohmic contact at least on each of said first and third regions, whereby said semiconductor device operates with low junction capacitance per unit area, stable breakdown voltage, and low surface leakage current.

2. The device of claim 1 wherein said first resistivity is at least 10 times greater than said second resistivity of said thin layer.

3. The device of claim 1 wherein said first resistivity is greater than 10 ohm-centimeters, said second resistivity is between about 1 ohm-centimeter and 10 ohm-centimeters and said layer is less than about 2 microns thick.

4. The device of claim 1 wherein the thickness of said layer with respect to said exposed surface is less than one-half the depth of said second region with respect to said exposed surface.

5. The device of claim 1 wherein said ohmic contact on said first region is made to a portion of said first region having lower resistivity than the remaining portion thereof.

6. Apparatus including the device of claim 5 and a potential source connected to said ohmic contacts on said first and third regions to apply a reverse bias across said first PN junction with said second region at a floating potential.

References Cited

UNITED STATES PATENTS

| | | | |
|---|---|---|---|
| 3,079,512 | 2/1963 | Rutz | 317—234 |
| 3,105,177 | 9/1963 | Aigrain et al. | 317—234 |
| 3,114,864 | 12/1963 | Sah | 317—234 |
| 3,307,984 | 3/1967 | Frazier | 317—235 X |
| 3,309,245 | 3/1967 | Haenichen | 317—235 X |

JAMES D. KALLAM, Primary Examiner

U.S. Cl. X.R.

317—234